(12) United States Patent
Mahler et al.

(10) Patent No.: US 7,968,378 B2
(45) Date of Patent: Jun. 28, 2011

(54) ELECTRONIC DEVICE

(75) Inventors: Joachim Mahler, Regensburg (DE); Edward Fuergut, Dasing (DE); Louis Vervoort, Pielenhofen (DE)

(73) Assignee: Infineon Technologies AG, Neubiberg (DE)

( * ) Notice: Subject to any disclaimer, the term of this patent is extended or adjusted under 35 U.S.C. 154(b) by 421 days.

(21) Appl. No.: 12/026,675

(22) Filed: Feb. 6, 2008

(65) Prior Publication Data
US 2009/0194882 A1 Aug. 6, 2009

(51) Int. Cl.
*H01L 21/00* (2006.01)

(52) U.S. Cl. .. 438/113; 438/460; 438/462; 257/E21.599

(58) Field of Classification Search ............... 438/113, 438/460, 462; 257/E21.599
See application file for complete search history.

(56) References Cited

U.S. PATENT DOCUMENTS

| | | | | |
|---|---|---|---|---|
| 5,155,068 A * | 10/1992 | Tada | ............... | 438/125 |
| 6,159,837 A * | 12/2000 | Yamaji et al. | ............... | 438/613 |
| 6,582,990 B2 | 6/2003 | Standing | | |
| 6,607,970 B1 * | 8/2003 | Wakabayashi | ............... | 438/462 |
| 6,614,104 B2 * | 9/2003 | Farnworth et al. | ............... | 257/686 |
| 6,624,522 B2 | 9/2003 | Standing et al. | | |
| 6,737,750 B1 * | 5/2004 | Hoffman et al. | ............... | 257/777 |
| 6,767,829 B2 | 7/2004 | Akahori | | |
| 6,869,824 B2 * | 3/2005 | Horng | ............... | 438/106 |
| 6,890,845 B2 | 5/2005 | Standing et al. | | |
| 6,946,325 B2 * | 9/2005 | Yean et al. | ............... | 438/112 |
| 7,049,177 B1 * | 5/2006 | Fan et al. | ............... | 438/123 |
| 7,091,581 B1 * | 8/2006 | McLellan et al. | ............... | 257/673 |
| 7,344,917 B2 * | 3/2008 | Gautham | ............... | 438/106 |
| 7,589,410 B2 * | 9/2009 | Kim | ............... | 257/686 |
| 7,618,886 B2 * | 11/2009 | Jobetto et al. | ............... | 438/613 |
| 2002/0001747 A1 * | 1/2002 | Jenson et al. | ............... | 429/162 |
| 2002/0094601 A1 * | 7/2002 | Su et al. | ............... | 438/106 |
| 2002/0197771 A1 * | 12/2002 | Dotta et al. | ............... | 438/114 |
| 2003/0022407 A1 * | 1/2003 | Sakamoto et al. | ............... | 438/22 |
| 2004/0018667 A1 * | 1/2004 | Joshi et al. | ............... | 438/126 |
| 2004/0082114 A1 * | 4/2004 | Horng | ............... | 438/126 |
| 2004/0110323 A1 * | 6/2004 | Becker et al. | ............... | 438/127 |
| 2004/0145044 A1 * | 7/2004 | Sugaya et al. | ............... | 257/698 |
| 2006/0278972 A1 | 12/2006 | Bauer et al. | | |
| 2007/0001278 A1 * | 1/2007 | Jeon et al. | ............... | 257/676 |
| 2007/0018313 A1 * | 1/2007 | Gomyo et al. | ............... | 257/723 |
| 2008/0032236 A1 * | 2/2008 | Wallace et al. | ............... | 430/319 |
| 2008/0246126 A1 * | 10/2008 | Bowles et al. | ............... | 257/659 |
| 2010/0090322 A1 * | 4/2010 | Hedler et al. | ............... | 257/676 |

OTHER PUBLICATIONS

Edward Furgut et al., "Taking Wafer Level Packaging to the Next Stage: A 200 mm Silicon Technology Compatible Embedded Device Technology", Infineon Technologies AG, SEMICON Europa 2006, Munich, Germany, Apr. 4, 2006.

* cited by examiner

*Primary Examiner* — Jarrett J Stark
(74) *Attorney, Agent, or Firm* — Dicke, Billig & Czaja, PLLC

(57) ABSTRACT

One embodiment provides a method of manufacturing semiconductor devices. For example, a sawn and expanded wafer is utilized having dielectrical material deposited between the diced and deposited chips. The method includes placing at least two chips on a metallic layer, depositing mold material on the metallic layer and between the chips, and selectively removing a portion of the mold material from the metallic layer to selectively expose a portion of the metallic layer. The method additionally includes covering the selectively exposed portion of the metallic layer with a conductive material, and singulating the at least two chips.

25 Claims, 10 Drawing Sheets

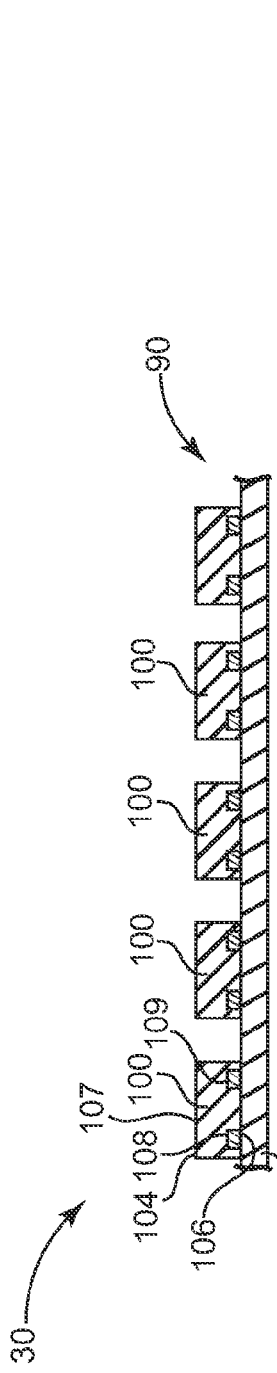
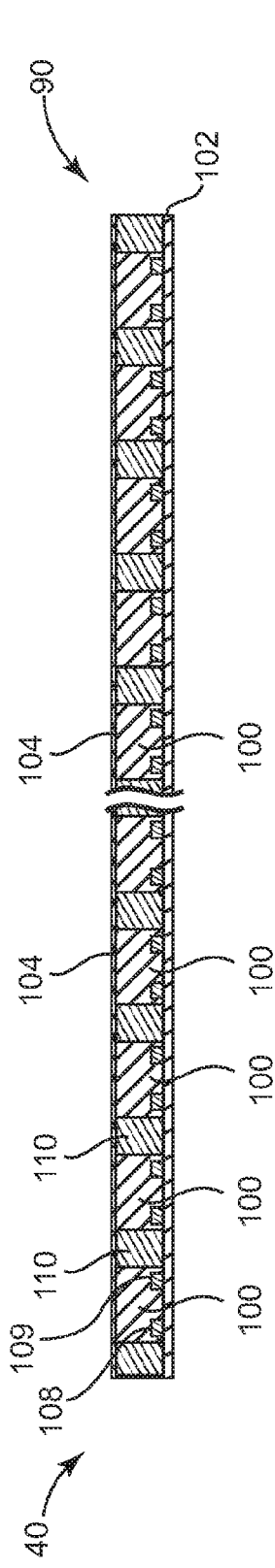
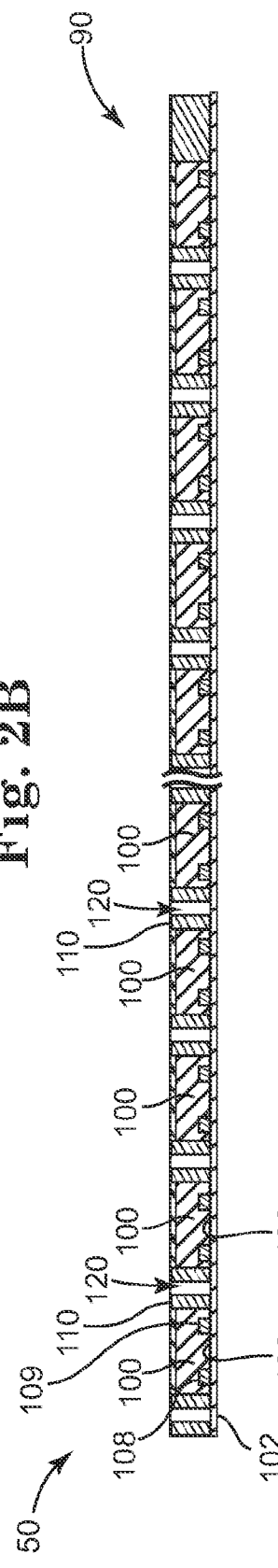

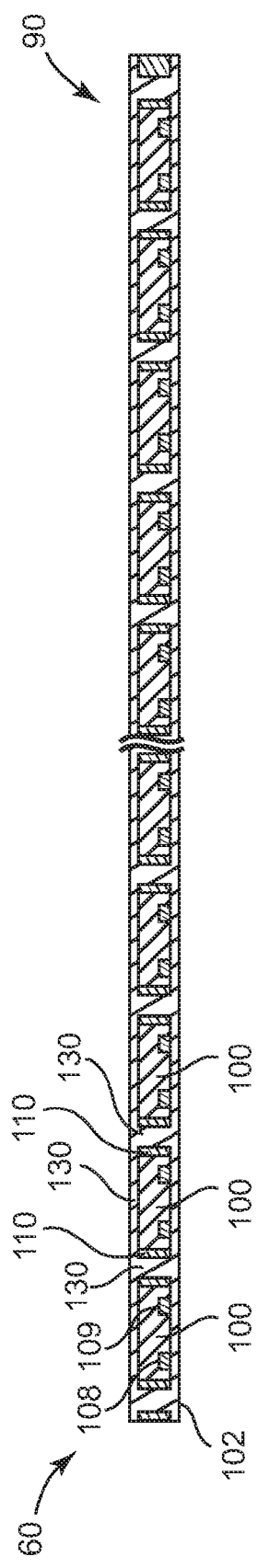
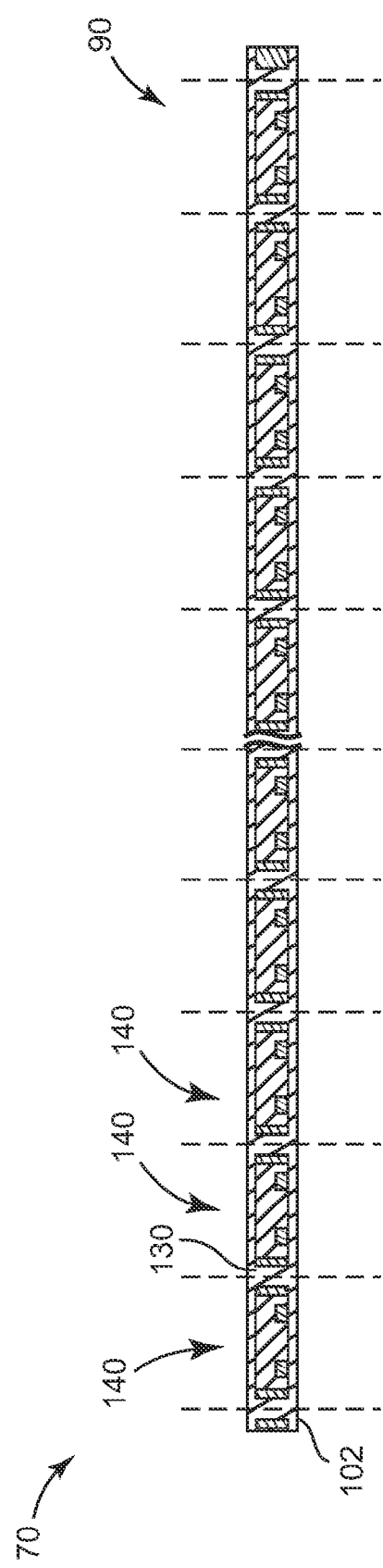

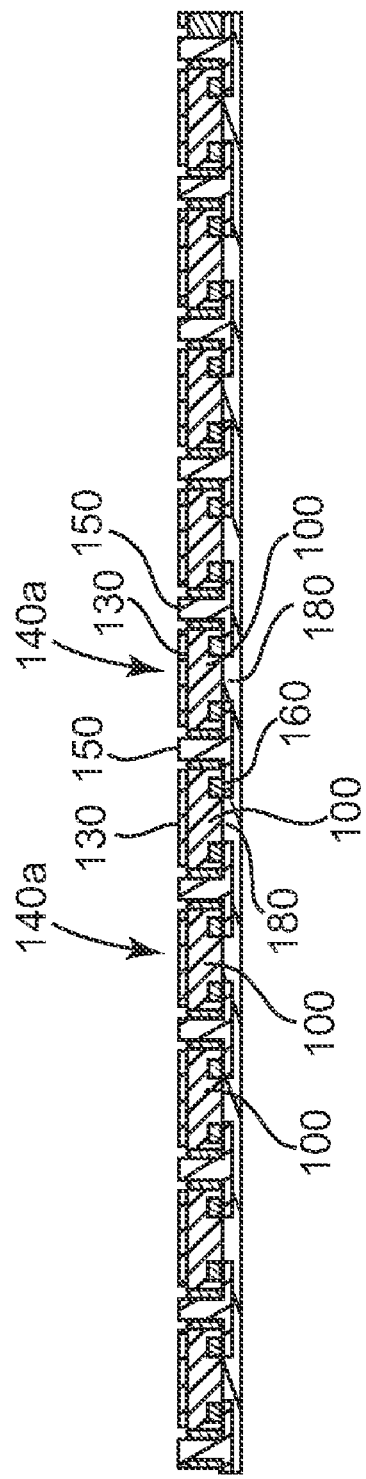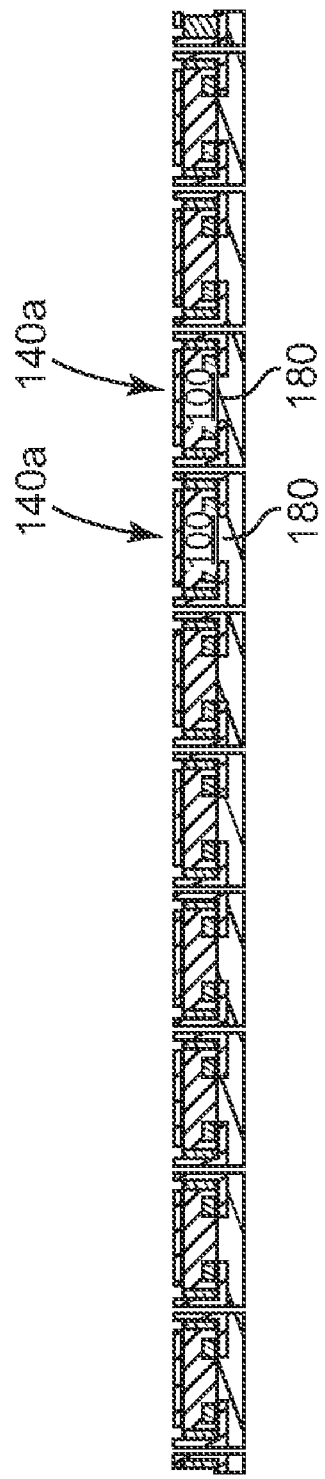

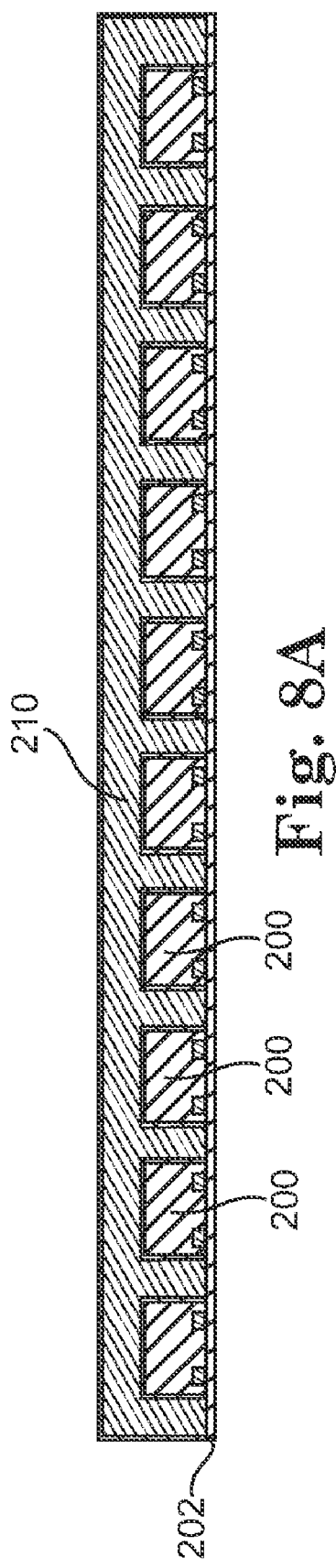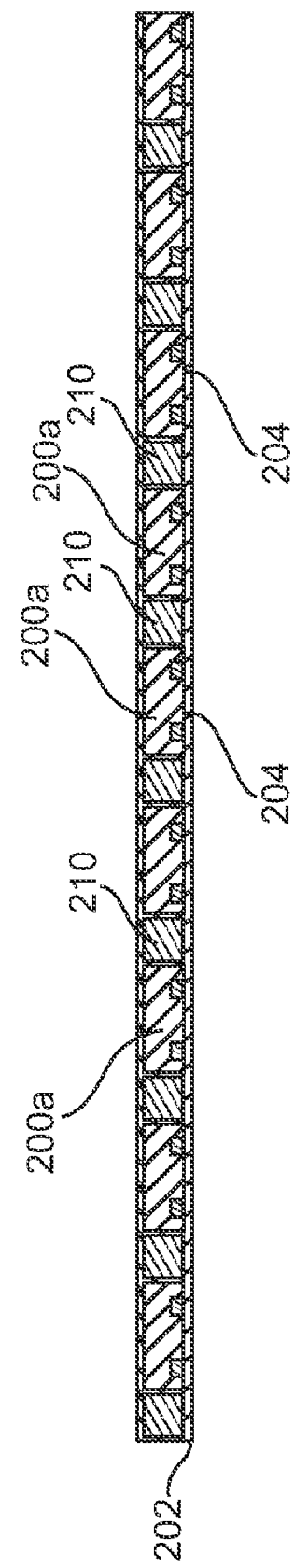

ELECTRONIC DEVICE

BACKGROUND

Market demand for smaller and more functional electronic devices has driven the development of semiconductor devices, including semiconductor packages, and entire systems disposed on a chip. Some electronic devices, such as cellular telephones, employ a variety of design-specific electronic components. The space available inside the electronic devices is limited, particularly as the electronic devices are made smaller. Other electronic devices, such as are employed in the automotive industry, are power devices that operate in demanding environments.

Some known semiconductor packages include a chip coupled to a substantial (i.e., sturdy) interposer and have a wire-bonded first level interconnect communicating between the chip/interposer and the outside world. The conventional interposer-based semiconductor package has a relatively low input/output density. In addition, the interposer increases the size of the semiconductor package, and in some cases, has the potential to undesirably affect the electrical and thermal performance of the semiconductor package.

Both the manufacturers and the consumers of electronic devices desire devices that are reduced in size and yet have increased device functionality.

For these and other reasons there is a need for the present invention.

SUMMARY

One aspect provides a method of manufacturing semiconductor devices that includes placing at least two chips on a metallic layer, depositing mold material on the metallic layer and between the chips, and selectively removing a portion of the mold material from the metallic layer to selectively expose a portion of the metallic layer. The method additionally includes covering the selectively exposed portion of the metallic layer with a conductive material, and singulating the at least two chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 2A-2E are cross-sectional views showing fabrication of a semiconductor device according to the flow chart shown in FIG. 1.

FIGS. 6A-6B are cross-sectional views of wafer level packages including a dielectric material deposited on one side of each chip according to one embodiment.

FIGS. 8A-8E are cross-sectional views of the fabrication of wafer level packages according to another embodiment.

DETAILED DESCRIPTION

Figure 1:
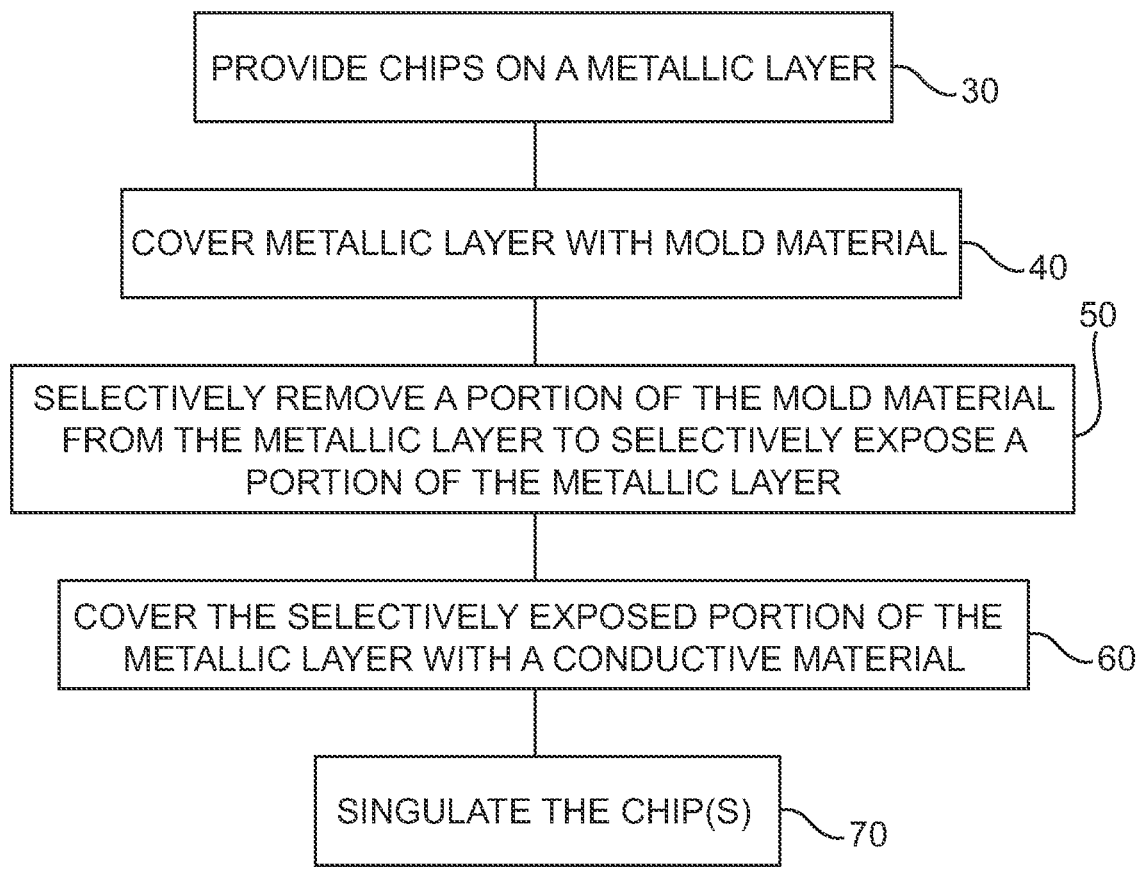
FIG. 1 is a diagram of a flow chart for a method of manufacturing a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Embodiments provide a method of fabricating a complete semiconductor package entirely in a complete wafer level process. For example, a sawn and expanded wafer is utilized having dielectrical material deposited between the diced and deposited chips. The semiconductor packages are ultimately singulated from the wafer for subsequent use with other devices. In one embodiment, a wafer including a metallization layer and chips coupled to the metallization layer is covered with polymeric dielectric mold material, and a portion of the polymeric dielectric mold material is selectively removed to expose a portion of the metallization layer. Subsequently, conductive material is deposited onto the selectively exposed portion of the metallization layer. The conductive material is ultimately structured to provide separate gate, source, and drain contacts for each chip carried by the wafer. After singulation from the wafer, complete semiconductor packages are provided that are suited for assembly and/or attachment to printed circuit boards or other electronic devices.

Embodiments provide premolded wafer level packages suited for powered devices. Some embodiments provide wafer level packages suited for thin powered devices. In one embodiment, the fabricated wafer level packages are coupled to a redistribution layer providing interconnects to active areas on each chip.

Embodiments provide a molded and singulated semiconductor package device formed on the wafer level and including a chip having a first electrode on a first surface, second and third electrodes on an opposite second surface, and discrete interconnect elements is extending from the electrodes on the second surface toward the first surface. The singulated semiconductor package device is configured to be electrically coupled to other electronic devices, and the interconnect elements provide a communication pathway between the first electrode and the second/third electrodes.

In one embodiment, a method is provided for singulating wafer level packages from a common metallic layer where the packages are singulated by sawing, or cutting through a polymer dielectric disposed between chips placed on the common metallic layer. Singulating through a polymer dielectric is easier (faster and less expensive) than singulating through a metal layer.

FIG. 1 is a diagram of a flow chart 20 providing a method of manufacturing one or more semiconductor devices. Fabrication flow chart 20 includes providing chips on a metallic layer at 30 and covering the metallic layer 30 with a dielectric mold material at 40. Metallic layer 30 is part of a sawn and expanded wafer, and dielectric mold material at 40 is deposited between already diced chips deposited on the wafer. Fabrication flow chart 20 provides fabrication of multiple packages on the wafer level, and it is to be understood that at least two chips are provided on a metallic layer, such as a metallized seed layer, a metallized substrate, a carrier, or other suitable metallic layer, in forming the wafer. In one embodiment, the wafer is reconfigured to include chips spaced apart to define a "fan-out" area on the wafer, and a metallized seed layer is deposited onto a major surface of a reconfigured wafer by chemical deposition, electroless deposition, or sputtering. In another embodiment, the chips are disposed onto a carrier including a metallic layer. The dielectric mold material includes polymeric and other molding materials and covers at least the metallic layer between the chips.

Fabrication flow chart 20 provides for selectively removing a portion of the mold material from the metallic layer to selectively expose a portion of the metallic layer at 50. Conductive material is deposited onto the selectively exposed portion of the metallic layer at 60. Ultimately, fabrication flow chart 20 includes singulation of chips at 70, in which semiconductor packages are individually formed/removed from the wafer. To this end, a plurality of complete semiconductor packages is thus fabricated entirely at the wafer level.

FIGS. 2A-2B are cross-sectional views of embodiments for manufacturing wafer level semiconductor packages.

FIG. 2A is a cross-sectional view of process 30 (FIG. 1) showing a wafer 90 including a plurality of chips 100 attached to a metallic layer 102. In one embodiment, wafer 90 is a reconfigured wafer including sawn chips 100 distributed in a fan-out format, and metallic layer 102 includes a metallized seed layer deposited over one side of wafer 90. In another embodiment, chips 100 are deposited onto a metal carrier 102.

In one embodiment, chips 100 include control chips, logic chips, vertical high voltage chips, power transistor chips, metal oxide semiconductor field effect transistor chips, or other suitable semiconductor dies. In one embodiment, metallized layer/metallic layer 102 includes a metallized seed layer configured for galvanically growing a metal layer and/or filling through-holes. In another embodiment, metallized layer/metallic layer 102 includes a metallized substrate and chips 100 are coupled to metallized substrate 102. Metallized seed layer and metallized substrate are hereafter referred to as metallic layer 102.

In one embodiment, each chip 100 includes a first major surface 104 opposite a second major surface 106. In one embodiment, first major surface 104 is an active surface of chip 100 including at least one electrode 107, for example a drain electrode in a field effect transistor (FET), and second major surface 106 is attached to metallic layer 102 such that active surface 104 faces away from metallic layer 102. In one embodiment, second major surface 106 is an active surface of chip 100 including a second electrode 108 and a third electrode 109 and is coupled to metallic layer 102 such that active surface 106 contacts metallic layer 102. In one embodiment, as described below, an interconnect is ultimately provided between surface 106 and surface 104 such that second electrode 108 is a source electrode and third electrode 109 is a gate electrode, for example in a FET, that communicate with drain electrode 107.

In one embodiment, chips 100 are configured for use in power devices and include a thickness between surfaces 104, 106 of greater than 60 micrometers. In another embodiment, chips 100 are configured for use in thin power devices and include a thickness between surfaces 104, 106 from 5-60 micrometers. Other thicknesses for chips 100 are also acceptable.

FIG. 2B is a cross-sectional view of process 40 (FIG. 1) showing wafer 90 including metallic layer 102 and chips 100 covered with mold material 110. In one embodiment, mold material 110 includes plastic, polymer dielectric, epoxy, silicone, or any of these materials including a filler such as silica or alumina filler, or other suitable molding material. In one embodiment, dielectrical material 110 is compression molded onto metallic layer 102 between chips 100. In another embodiment, dielectrical material 110 is transfer molded onto metallic layer 102 between chips 100. Other deposition processes for covering metallic layer 102 and chips 100 with a dielectrical material 110 (or mold material 110) are also acceptable, such as liquid coverage, spin coating, or casting a silicone material over chips 100.

FIG. 2C is a cross-sectional view of process 50 (FIG. 1) in which a portion of mold material 110 is selectively removed from metallic layer 102 to expose metallic layer 102 within spacings 120. In one embodiment, selectively removing a portion of mold material 110 from metallic layer 102 includes etching, drilling, sawing, electromagnetically irradiating a portion of mold material 110 followed by removal of the irradiated material, or photolithographically removing a portion of mold material 110. Chip 100 is bounded by mold material 110 on the sides, and by metallic layer 102 along second major surface 106. Metallic layer 102 is exposed within spacings 120 along wafer 90.

FIG. 2D is a cross-sectional view of process 60 (FIG. 1) in which a conductive material 130 is deposited into spacings 120 (FIG. 2C) and into electrical contact with exposed portions of metallic layer 102. Conductive material 130 includes copper, alloys of copper, silver, alloys of silver, aluminum, alloys of aluminum, titanium, or other materials having suitably high thermal and electrical conductivity deposited onto wafer 90.

In one embodiment, conductive material 130 is deposited into spacings 120 (FIG. 2C) between each chip 100. In another embodiment, conductive material 130 is deposited into spacings 120 between each chip 100 and over each chip 100. Conductive material is deposited with any suitable deposition process. Suitable deposition processes include chemical deposition, galvanic deposition, vapor deposition, sputtering, or otherwise coating a conductive material of suitably high thermal and electrical conductivity at least into spacings 120 over metallic layer 102.

FIG. 2E is a cross-sectional view of process 70 (FIG. 1) in which metallic layer 102 and conductive material 130 are separated between the chips 100 to define complete individualized semiconductor packages 140 fabricated on wafer 90 according to one embodiment. In one embodiment, packages 140 are singulated by sawing, cutting, laser cutting, or etching through conductive material 130 between each chip 100. Other suitable processes for singulating packages 140 are also acceptable.

Figure 3:
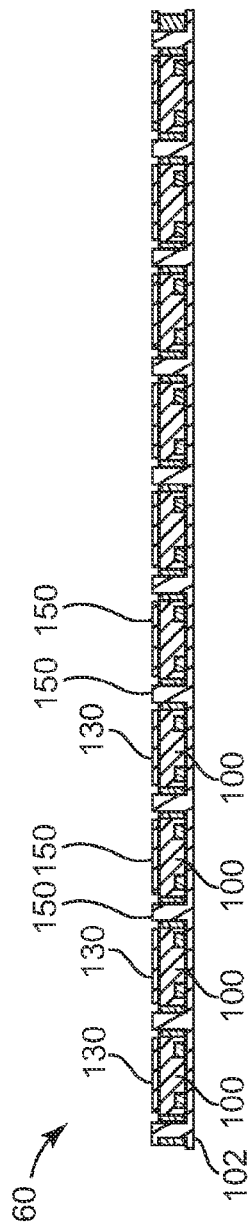
FIG. 3 is a cross-sectional view of contacts structured on a wafer level relative to chips provided by the wafer according to one embodiment.

FIG. 3 is a cross-sectional view showing conductive material 130 selectively structured to define contacts 150. In one embodiment, conductive material 130 is opened (e.g., a portion of conductive material 130 is selectively removed) to define contacts 150. In one embodiment, contacts 150 provide interconnects on each side of chip 100, where contacts 150 extend from surface 106 to be co-planar with surface 104.

The selective removal of a portion of conductive material 130 is completed in a suitable removal process. Suitable removal processes include etching (chemical or energetic), photolithography, or laser etching. For example, in one embodiment a portion of conductive material 130 is selectively etched to define contacts 150. In another embodiment, conductive material 130 is photolithographically masked, photo-activated and etched, and subsequently opened to define contacts 150. Other suitable processes for structuring conductive material 130 to define contacts 150 is also acceptable.

Figure 4:
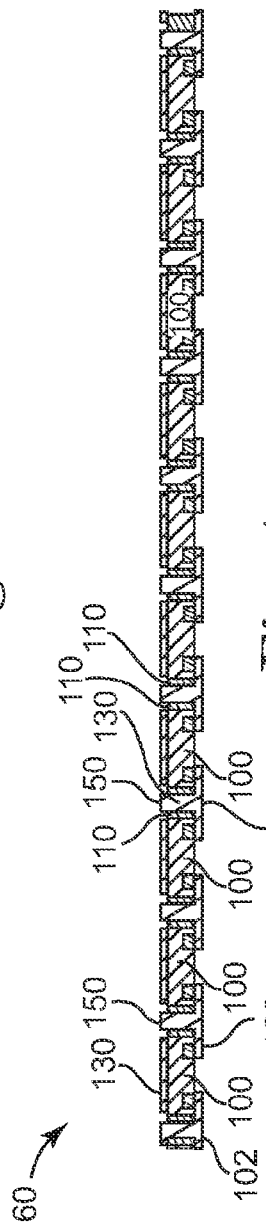
FIG. 4 is a cross-sectional view of source, gate, and drain contacts structured on wafer level packages according to one embodiment.

FIG. 4 is a cross-sectional view showing conductive material 130 optionally opened to define contacts 160. In one embodiment, interconnect contacts 150 are structured projecting from metallic layer 102, and contacts 160 are structured along metallic layer 102 in communication with source 108 and gate 109 electrodes. Each chip 100 includes a frame connecting contact 150, interconnecting contacts 160, and a boundary of mold material 110. In one embodiment, each chip 100 is separated from an adjacent chip 100 by conductive material 130.

Figure 5A:
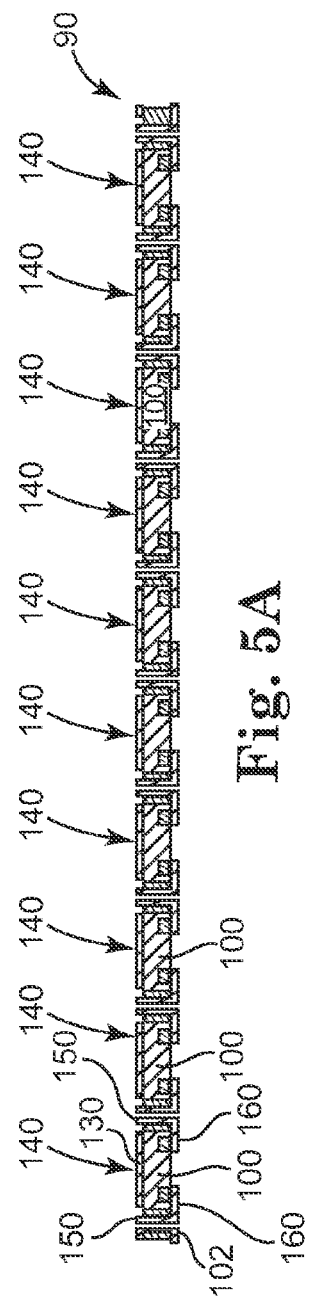
FIG. 5A is a cross-sectional view showing semiconductor packages singulated from the wafer shown in FIG. 4 according to one embodiment.

FIG. 5A is a cross-sectional view of packages 140 singulated from wafer 90. Each package 140 includes at least one chip 100, and in some embodiments, at least two chips 100. In one embodiment, packages 140 are singulated by sawing or cutting through conductive material 130 (FIG. 4) between chips 100 and metallic layer 102 to define discrete semiconductor packages 140 fabricated on the wafer level.

Figure 5B:
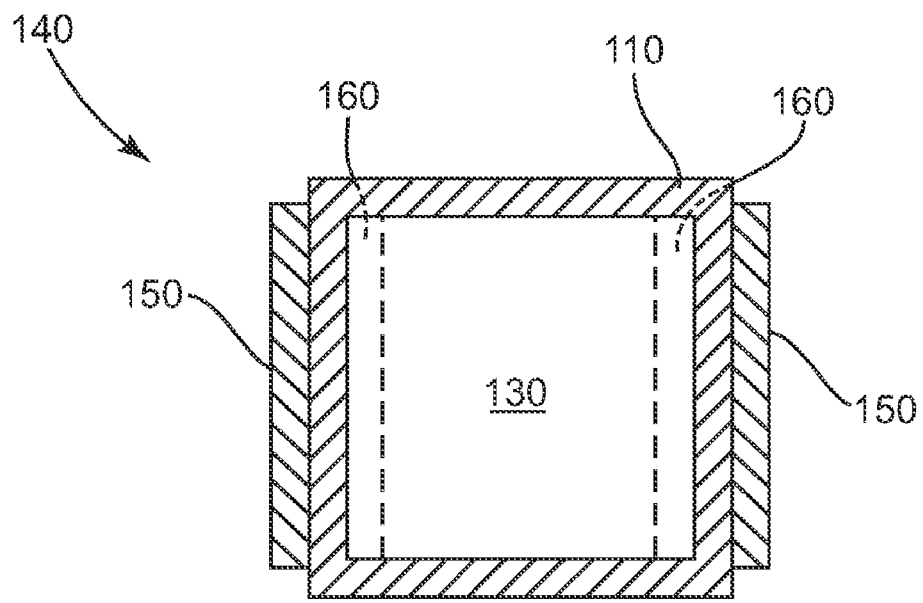
FIG. 5B is a top view of one of the singulated semiconductor packages shown in FIG. 5A.

FIG. 5B is a top view of one of the singulated semiconductor packages 140 shown in FIG. 5A. Contacts 150 are separated from chip 100 (not visible in this view, but underneath contact 130) by mold material 110. In one embodiment, package 140 is symmetric and includes contacts 150 on all four sides separated from chip 100 (FIG. 5A) by mold material 110.

Figure 5C:
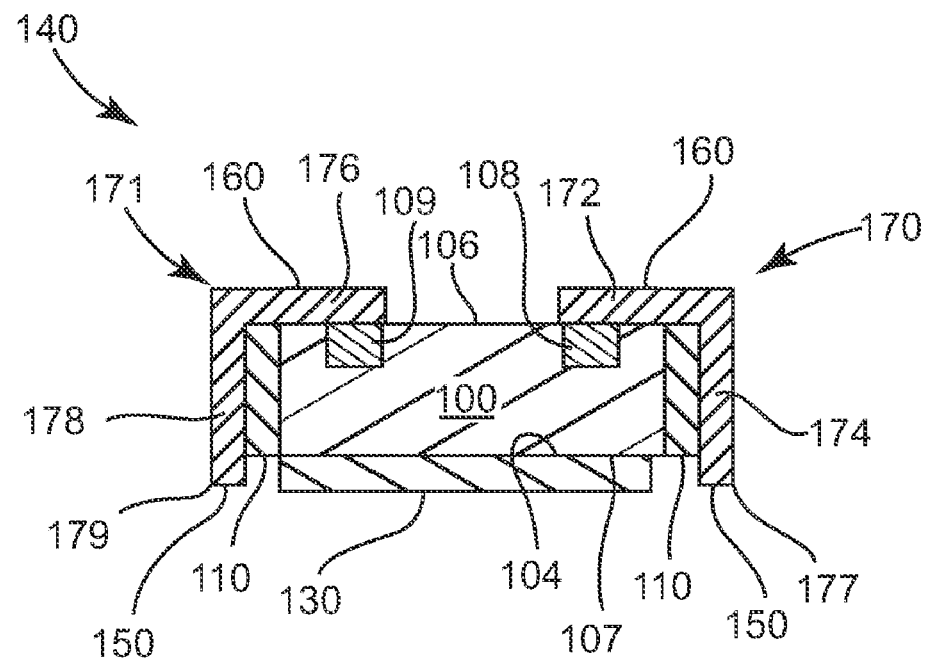
FIG. 5C is a side view of one of the semiconductor packages shown in FIG. 5A after being singulated from the wafer.

FIG. 5C is a side view of one of the semiconductor packages 140 fabricated on the wafer level after singulation from wafer 90. Wafer level-fabricated semiconductor package 140 is oriented for connection to a printed circuit board or other electronic device. Conductive material 130 is suited for frame interconnection or connection to boards and the like, and defines a drain relative to source and gate electrodes 108, 109. Interconnects 150 extend from a co-planar level with conductive material 130/drain 130 to electrodes 108, 109.

In one embodiment, conductive material 130 defines a first metal layer covering electrode 107, and contacts 150, 160 combine to define first and second interconnects 170, 171, respectively. In one embodiment, first interconnect 170 includes a first metal layer segment 172 in contact with electrode 108 and an interconnect element 174 integrally formed with first metal layer segment 172 and extending toward first surface 104. Interconnect element 174 is spaced apart from chip 100 by mold material 110 and defines a side face of semiconductor device 140. In one embodiment, second interconnect 171 includes a second metal layer segment 176 in contact with electrode 109 and an interconnect element 178 integrally formed with second metal layer segment 176 and extending toward first surface 104. Interconnect element 178 is spaced apart from chip 100 by mold material 110 and defines a side face of semiconductor device 140. In one embodiment, an end 177 of interconnect element 174 and an end 179 of interconnect 178 of contacts 150 are co-planar with conductive material 130.

FIG. 6A is a cross-sectional view of packages 140a including structured contacts 150 and optional encapsulation material 180 covering a backside of chips 100 between contacts 160. Chips 100 are as described above. In one embodiment, the backsides of chips 100 are encapsulated in a mold material 180 to protectively encase a backside of chip 100. In one embodiment, encapsulation material 180 is a thermal insulator such that chips 100 cool uni-directionally (i.e., encapsulation material 180 is not a heat sink).

FIG. 6B is a cross-sectional view of singulated semiconductor packages 140a including backside encapsulation material 180. In one embodiment, metal contacts 150 provide a saw street down for a saw to singulate individual semiconductor packages 140a from the wafer level. Exposed portions of contacts 150 define sides of semiconductor package 140a, and it is to be understood that these metal surfaces can include coatings to impede undesirable oxidation of the metal or improve electrical properties.

Figure 7A:
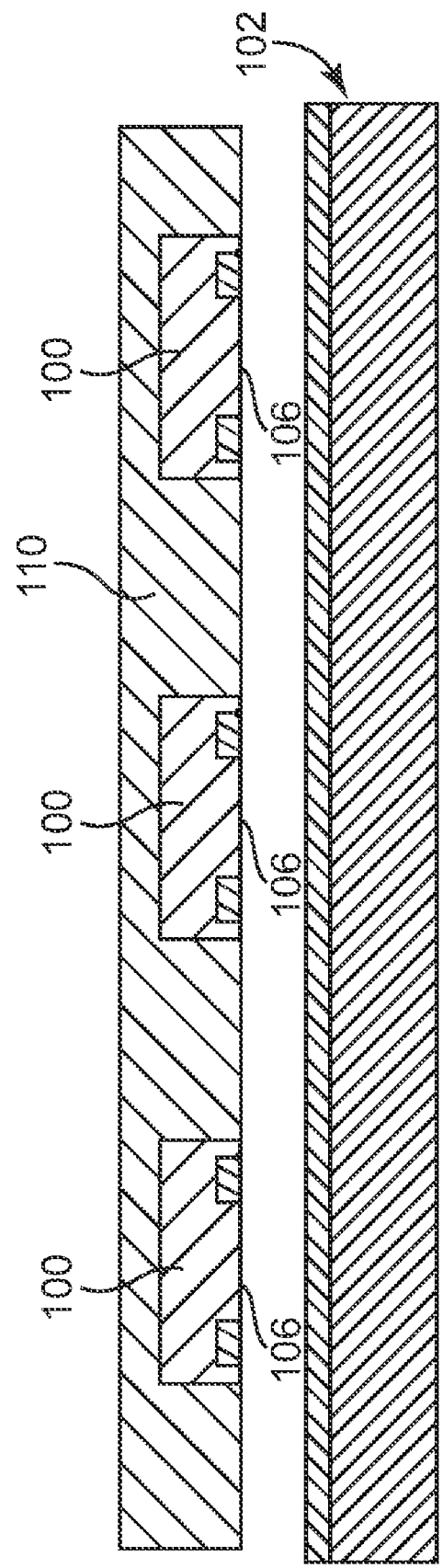
FIG. 7A is a cross-sectional view of chips and surrounding mold material delaminated from a carrier according to one embodiment.

FIG. 7A is a cross-sectional view of chips 100 and mold material 110 covering chips 100 as provided by an expanded wafer according to one embodiment. In one embodiment, chips 100 are sawn and deposited onto a wafer in an expanded manner with dielectrical mold material 110 deposited between the swan and expanded chips 100. FIG. 7A provides a starting point for wafer level processing, after chips 100 and mold material 110 are separated from a carrier 102 to expose an active surface 106 of chip 100 prior to connecting the active surfaces 106 of chips 100 to a redistribution layer described below.

Figure 7B:
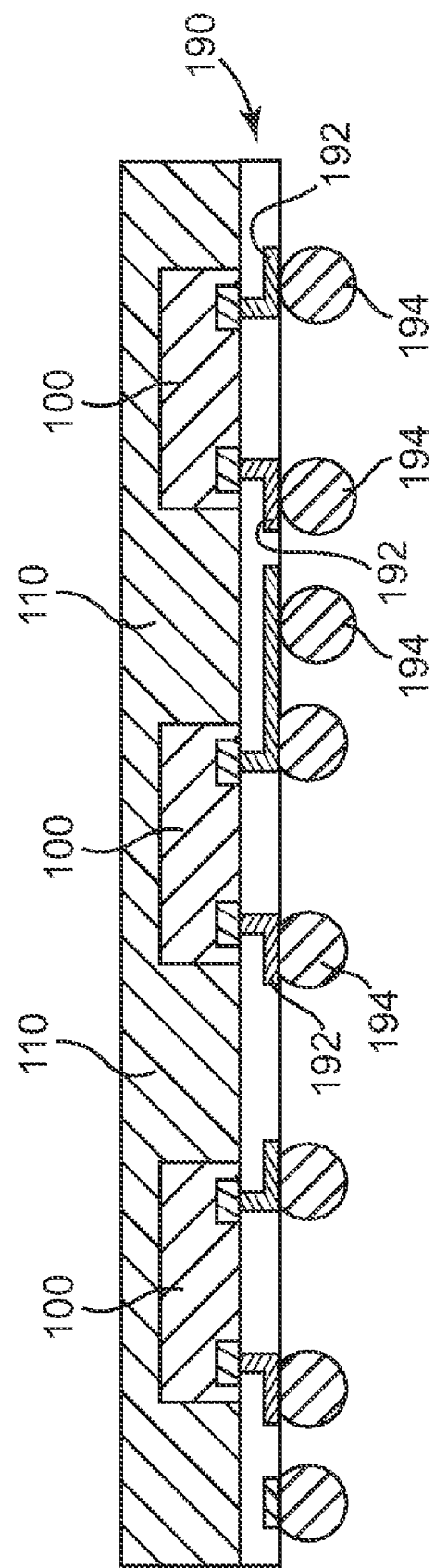
FIG. 7B is a cross-sectional view of the chips and the surrounding mold material attached to a redistribution layer according to one embodiment.

FIG. 7B is a cross-sectional view of chips 100 and mold material 110 coupled to a layer 190 according to one embodiment. Layer 190 includes conducting areas formed by contacts 192 and solder balls 194 in contact with contacts 192. Contacts 192 are coupled to active surfaces of each chip 100. In one embodiment, layer 190 includes a redistribution layer configured for application to one or more chips of a reconfigured wafer, where the redistribution layer provides second layer interconnection to other electronic devices. Chips 100 are configured to electrically communicate through contacts 192 with other devices to which solder balls 194 are attached. In one embodiment, solder balls 194 of layer 190 are attached to printed circuit boards or other devices to enable electrical communication between chips 100 and the printed circuit board.

FIGS. 8A-8E are cross-sectional views of the fabrication of wafer level packages for thin powered devices according to another embodiment.

FIG. 8A is a cross-sectional view of chips 200 disposed on metallic layer 202 and including mold material 210 covering chips 200 and metallic layer 202. Chips 200 are similar to chips 100 (FIG. 2A) but are configured as thin power chips, metallic layer 202 is similar to metallic layer 102 (FIG. 2A), and mold material 210 is similar to mold material 110 (FIG. 2B) described above.

FIG. 8B is a cross-sectional view of a portion of mold material 210 and chips 200 planarized to provide thin chips 200a attached to metallic layer 202. Chips 200 are planarized with a suitable grinding process as known in the art, such as grinding. Planarized chips 200a are separated by mold material 210 and include a surface 204 coupled to metallic layer 202. In one embodiment, chips 200a are planarized and include a portion of mold material 210 along an upper surface (as oriented) of the wafer. In one embodiment, surface 204 of chips 200a is an active surface oriented to face toward metallic layer 202.

In one embodiment, chips 200a are thin chips configured for use in power devices and include a thickness between the major surfaces of less than 60 micrometers. In one embodiment, chips 200a have a thickness between about 5-60 micrometers. Other thicknesses for chips 200a are also acceptable.

In one embodiment, planarized chips 200a are provided on a wafer, and the wafer can possess a high degree of flex due to the thin, planarized thickness of chips 200a. To this end, in one embodiment metallic layer 204 and mold material 210 combine to provide a carrier to support wafer/chips 200 during processing and fabrication.

Figure 8C:
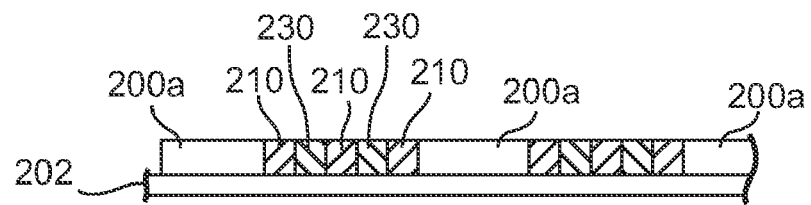

FIG. 8C is a cross-sectional view illustrating a portion of mold material 210 selectively removed from between chips 200a to expose a portion of metallic layer 202 and including conductive material 230 deposited between remaining portions of mold material 210 and in contact with metallic layer 202. For example, the central portion of mold material 210 is flanked on either side by conductive material 230, and the remaining mold material 210 is disposed between conductive material 230 and chips 200a. In one embodiment, these alternating columns of mold 210 and conductive 230 material are disposed between adjacent chips 200a, such that a stratum of mold material 210/conductive material 230/mold material 210/conductive material 230/mold material 210 is deposited between chips 200a. Subsequently, at least one of mold material 210 and conductive material 230 is patterned/structured to define features/contacts of a semiconductor package.

Figure 8D:
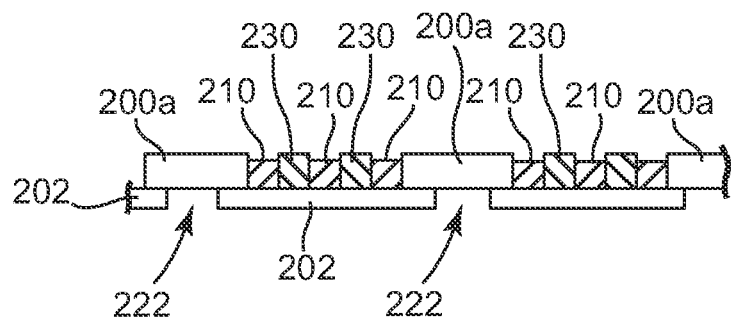

FIG. 8D is a cross-sectional view of conductive material 230 between chips 200a selectively structured to define contacts. In one embodiment, metallic layer 202 has been opened at locations 222 under each chip 200a. Metallic layer 202 and conductive material 230 combine to define interconnects extending from lower electrodes on chips 200a and projecting upwards toward upper electrodes formed on chips 200a. For example, in one embodiment metallic layer 202 defines a horizontal metal layer segment in contact with a lower major surface of chip 200a and conductive material 230 defines an interconnect element extending from the horizontal metal layer segment towards an opposing major surface of chip 200a.

Figure 8E:
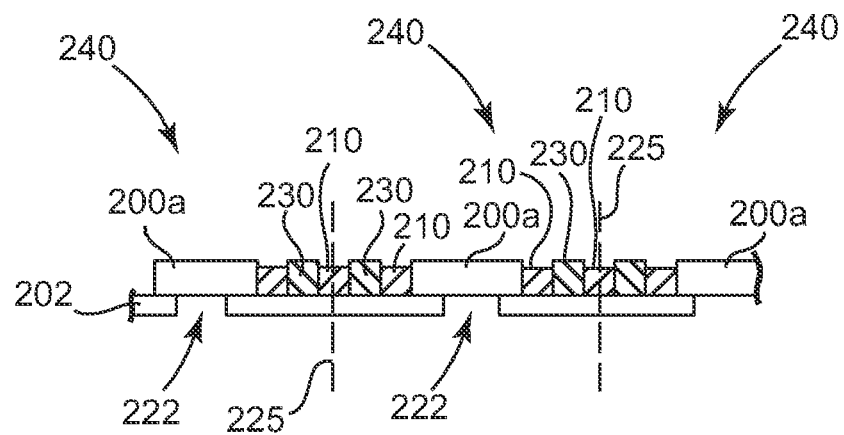

FIG. 8E is a cross-sectional view of wafer level semiconductor packages 240 singulated along saw lines 225 that cut through mold material 210. In one embodiment, central mold material 210 includes plastic or a polymer dielectric and packages 240 are singulated by cutting through the relatively soft mold material 210 to separate packages 240. Conductive material 230 and portions of metallic layer 202 provide contacts for each package 240 as described above. When singulated, conductive material 230 is separated from chip 200a by mold material 210 and defines a side face of the singulated package 240.

Wafer level semiconductor packages are provided that are completely formed on the wafer level and subsequently singulated to provide discrete semiconductor packages. In one embodiment, the semiconductor packages are singulated by sawing through conductive material deposited between chips within each package. In another embodiment, the semiconductor packages are singulated by sawing through a soft polymer dielectric deposited within each package.

Embodiments provide wafer level packages for powered devices including thin wafer level packages for powered devices. In some embodiments, the wafer level packages are subsequently coupled to a redistribution layer suited for attachment to printed circuit boards and other electronic devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of a pre-molded wafer level package as discussed herein. Therefore, it is intended that this invention be limited only by the claims and the equivalents thereof.

What is claimed is:

1. A method of manufacturing semiconductor devices comprising:
    providing at least two chips on a continuous metallic layer;
    depositing mold material on the metallic layer and between the chips;
    selectively removing a portion of the mold material from the metallic layer to selectively expose a portion of the metallic layer;
    covering the selectively exposed portion of the metallic layer with a conductive material; and
    singulating the at least two chips.

2. The method of claim 1, wherein providing at least two chips on a metallic layer comprises providing a plurality of chips, each chip including an active surface in contact with the metallic layer.

3. The method of claim 1, wherein depositing mold material comprises one of transfer molding and compression molding a polymer dielectric material over the at least two chips and the metallic layer.

4. The method of claim 1, wherein depositing mold material comprises one of liquid forming, spin coating, and casting a polymer dielectric material over the at least two chips and the metallic layer.

5. The method of claim 1, wherein selectively removing a portion of the mold material from the metallic layer comprises one of etching, drilling, sawing, and electromagnetically irradiating a portion of the mold material away from the metallic layer.

6. The method of claim 1, wherein covering the selectively exposed portion of the metallic layer with a conductive material comprises covering the selectively exposed portion of the metallic layer and the at least two chips with a conductive material.

7. The method of claim 1, wherein covering the selectively exposed portion of the metallic layer with a conductive material comprises one of chemically depositing conductive material, vapor depositing conductive material, and sputtering conductive material onto the selectively exposed portion of the metallic layer.

8. The method of claim 1, further comprising:
    structuring the conductive material by selectively etching the conductive material.

9. The method of claim 8, further comprising:
protectively covering backsides of each chip with an electrically non-conducting material.

10. The method of claim 1, further comprising:
structuring the metallic layer by selectively etching the metallic layer.

11. The method of claim 1, further comprising:
removing the mold material from the metallic layer.

12. The method of claim 11, further comprising:
applying a conducting layer over the chip and the mold material.

13. The method of claim 1, wherein singulating the at least two chips comprises one of sawing the mold material, cutting the mold material, etching the mold material, and irradiating the mold material with electromagnetic radiation.

14. The method of claim 1, wherein singulating the at least two chips comprises one of sawing the conductive material, cutting the conductive material, etching the conductive material, and irradiating the conductive material with electromagnetic radiation.

15. The method of claim 1, wherein singulating the at least two chips comprises one of sawing the metallic layer, cutting the metallic layer, etching the metallic layer, and irradiating the metallic layer with electromagnetic radiation.

16. The method of claim 1, wherein providing at least two chips on a metallic layer comprises providing a reconfigured wafer including a plurality of chips disposed on a metallized seed layer.

17. A method of manufacturing semiconductor devices comprising:
providing at least two chips directly on a continuous, planar metallic layer extending between the at least two chips;
depositing mold material directly on the metallic layer and between the chips;
selectively removing a portion of the mold material from the metallic layer to selectively expose a portion of the metallic layer;
covering the selectively exposed portion of the metallic layer with a conductive material; and
singulating the at least two chips.

18. The method of claim 17, wherein providing the at least two chips directly on the metallic layer comprises providing a plurality of chips, each chip including an active surface directly contacting the metallic layer, and
wherein the metallic layer consists of one of a metallized seed layer, a metallized substrate, and a metal carrier.

19. The method of claim 17, wherein providing the at least two chips directly on the metallic layer comprises providing a plurality of chips, each chip including a first electrode directly contacting the metallic layer, and
wherein covering the selectively exposed portion of the metallic layer with the conductive material comprises covering the selectively exposed portion of the metallic layer and each chip with the conductive material such that the conductive material directly contacts a second electrode of each chip.

20. The method of claim 19, wherein the first electrode is at a first major surface of each chip and the second electrode is at a second major surface of each chip opposite the first major surface.

21. The method of claim 17, wherein providing the at least two chips directly on the metallic layer comprises providing a reconfigured wafer including a plurality of chips directly contacting a metallized seed layer.

22. A method of manufacturing semiconductor devices comprising:
providing at least two chips, each chip comprising a first electrode and a second electrode, the first electrode at a first major surface of each chip and the second electrode at a second major surface of each chip opposite the first major surface;
attaching the at least two chips to a continuous metallic layer such that the first electrode of each chip directly contacts the metallic layer, the metallic layer extending between the at least two chips;
depositing mold material directly on the metallic layer and between the chips;
selectively removing a portion of the mold material from the metallic layer to selectively expose a portion of the metallic layer;
covering the selectively exposed portion of the metallic layer and each chip with a conductive material such that the conductive material directly contacts the second electrode of each chip; and
singulating the at least two chips.

23. The method of claim 22, further comprising:
structuring the conductive material by selectively etching the conductive material to expose at least a portion of the mold material.

24. The method of claim 22, further comprising:
structuring the metallic layer by selectively etching the metallic layer to expose at least a portion of each chip.

25. The method of claim 22, wherein attaching the at least two chips to the metallic layer comprises attaching the at least two chips to a metallized seed layer.

* * * * *